United States Patent [19]

Lentfer et al.

[11] Patent Number: 4,701,391
[45] Date of Patent: Oct. 20, 1987

[54] MASK WITH MAGNESIUM DIAPHRAGM FOR X-RAY LITHOGRAPHY

[75] Inventors: Arno Lentfer, Hamburg; Holger Lüthje, Halstenbek, both of Fed. Rep. of Germany

[73] Assignee: U.S. Philips Corporation, New York, N.Y.

[21] Appl. No.: 824,294

[22] Filed: Jan. 24, 1986

Related U.S. Application Data

[63] Continuation of Ser. No. 528,355, Aug. 31, 1983, abandoned.

[30] Foreign Application Priority Data

Sep. 1, 1982 [DE] Fed. Rep. of Germany ....... 3232499

[51] Int. Cl.$^4$ .......................... G21K 5/00; G03F 1/00
[52] U.S. Cl. ......................................... 430/5; 378/35; 430/967
[58] Field of Search ...................... 430/5, 967; 378/35

[56] References Cited

U.S. PATENT DOCUMENTS

| | | | |
|---|---|---|---|
| 3,743,842 | 7/1973 | Smith et al. | 378/35 |
| 4,454,209 | 6/1984 | Blais | 430/5 |
| 4,468,799 | 8/1984 | Harms et al. | 378/35 |

*Primary Examiner*—Richard L. Schilling
*Attorney, Agent, or Firm*—Paul R. Miller

[57] ABSTRACT

A mask for X-ray lithography is formed of a multilayer diaphragm with a patterned absorber layer on the diaphragm. The diaphragm includes a layer of magnesium and at least one intermediate layer.

1 Claim, 1 Drawing Figure

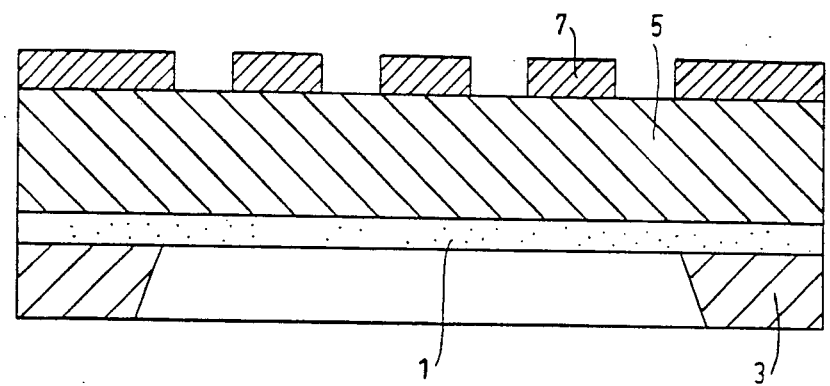

MASK WITH MAGNESIUM DIAPHRAGM FOR X-RAY LITHOGRAPHY

This is a continuation of application Ser. No. 528,355, filed Aug. 31, 1983, now abandoned.

The invention relates to a mask for the formation of patterns in lacquer layers by means of X-ray lithography comprising a diaphragm highly transparent to X-ray radiation and a layer present on one of the major surfaces of the diaphragm for absorbing the X-ray radiation and structured in accordance with the pattern to be produced.

The article by E. Spiller and R. Feder "X-ray Lithography" in "Topics in Current Physics: X-ray Optics", Springer, N.Y., 1977, p. 35–92 discloses what is the important part played by X-ray lithography in the manufacture of, for example, semiconductor systems or magnetic cylindrical domain devices because especially in these manufacturing processes there is a growing interest in increasingly smaller structures in the $\mu$m and nm range. For all high resolution methods, accurate and very precisely defined masks are required. The suitability of X-ray lithography becomes manifest by the minimum strip width of the structures that can be attained with it: photolithography $\approx 2$ to 3 $\mu$m, electron beam lithography 0.05 to 0.1 $\mu$m, X-ray lithography <150 nm.

The use of X-rays for the exposure of a lacquer to be structured involves the advantage that disturbing diffraction phenomena in the projection of the mask structures onto the lacquer layer are reduced.

The exposure to X-rays requires special irradiation masks for structure production in the lacquer. Such a mask consists of the pattern of the structure to be manufactured consisting of a material strongly absorbing X-rays (designated hereinafter as absorber or absorber pattern) with the absorber pattern being applied to a thin diaphragm of a material as highly transparent as possible to X-rays.

For the absorber materials' can be used having an atomic weight as high as possible; for example, gold, molybdenum and tungsten have proven satisfactory in practice.

As material for the diaphragm practically all those materials can be used which are sufficiently transparent to X-rays. Since in the X-ray range, however, no material is fully transparent and no material is fully opaque, the diaphragm should be comparatively thin in order that a higher possible transparency to X-rays is guaranteed. However, the absorber pattern should be comparatively thick in order that a highest possible absorption of X-rays is ensured.

For the manufacture of the diaphragm a series of materials have been examined already. A great variety of difficulties were found to occur. In the indicated part of the article by Spiller and Feder, a composition of materials used hitherto for the manufacture of diaphragms for X-ray lithography has been mentioned. A distinction can be made between inorganic materials, such as Si, SiC, $Si_xN_y$, BN, $Al_2O_3$, Be, Ti and organic materials, such as, for example, polyimide, polycarbonate, polyterephthalate, polyethylene.

It has been found that masks comprising diaphragms of organic materials have a high transparency to X-ray radiation and a comparatively great breaking strength, but these materials have the disadvantage that their accuracy is already adversely affected under normal environmental conditions. They age strongly under the influence of X-ray radiation and have a tendency to warp at a higher air humidity.

The masks comprising diaphragms of the inorganic materials do not change under environmental conditions and retain their accuracy to size, but, except for beryllium and titanium, they are very liable to break so that they are not particularly suitable for mass production.

Titanium has favourable properties as diaphragm material. Such diaphragms have a comparatively great breaking strength and retain their accuracy to size also with temperature and air humidity fluctuations. In this case, however, there is the disadvantage that the production cost for titanium is extremely high. Apart from the expensive starting materials, the required investments for the manufacture of titanium are so high that titanium is a comparatively costly material.

Because of its toxic effect, Be can be processed only with great care so that the use of produced masks comprising beryllium diaphragms does not seem advisable.

SUMMARY OF THE INVENTION

The invention has for its object to provide a mask for X-ray lithography in which advantages of the organic and inorganic materials for diaphragms are united, but in which the disadvantages of these materials are avoided. The mask consequently has a high transparency to X-ray radiation, is not liable to break, retains its accuracy to size under normal operating conditions (such as under the influence of X-rays and increased air humidity), and moreover is advantageous because of the material cost price.

According to the invention, this is achieved in that the diaphragm consists of magnesium.

According to an advantageous further embodiment of the invention, the diaphragm is constituted by a multi-layer structure in a manner such that a magnesium layer is applied to a substrate which consists of a material highly transparent to X-ray radiation. This involves the advantage that diaphragms of comparatively large dimensions and extremely transparent to X-ray radiation can be manufactured.

DETAILED DESCRIPTION OF THE INVENTION

A method of manufacturing the mask according to the invention is characterized in that a magnesium layer is applied to an auxiliary carrier, which either is left in the mask structure or is subsequently removed, in that the diaphragm thus formed is stretched and secured on a supporting frame and in that then a layer absorbing X-rays is applied to one of the major surfaces of the diaphragm which is structured in accordance with the desired mask pattern.

According to advantageous embodiments of the invention, the auxiliary carrier is constituted by a foil of a synthetic material, more particularly of polyimide or polycarbonate. This involves the advantage that the auxiliary carrier can be retained as a part of the mask because both synthetic materials are highly transparent to X-rays and are particularly suitable for use as a diaphragm material in conjunction with the magnesium layer compensating for their unfavourable properties for diaphragm application. A further advantage is that with such a composite mask comparatively large diaphragms can be manufactured, which nevertheless operate with a very high accuracy to size, even under unfavourable environmental conditions.

The further advantages obtained by the use of the invention especially consist in that a mask for X-ray lithography particularly suitable for mass production is provided, in which the favourable properties of the inorganic materials known for such diaphragms are united with the favourable properties of the organic materials known for the same purpose while avoiding the disadvantages of these materials. The cost price of these masks is very favourably influenced by the use of magnesium for the diaphragm in masks for X-ray lithography. The cost price of magnesium is about one tenth of the price of titanium. A further advantage is that magnesium has an extremely high transparency to X-ray radiation just in the range between 1 and 4 nm. Because of the lacquer sensitivity generally increasing with an increasing wave-length as well as because of the only just permissible diffraction phenomena, especially this wave-length range is of particular importance for X-ray lithography. A magnesium diaphragm is particularly suitable for X-ray apparatus working with a copper target. In such apparatus, CuK$\alpha$ radiation of a wave-length $\lambda = 1.34$ nm is produced. However, a mask comprising a magnesium diaphragm would also be very suitable for exposure apparatus working with synchrotron radiation.

In order that the invention may be readily carried out, it will now be described more fully, by way of example, with reference to the accompanying drawing, in which:

The sole FIGURE is a sectional view of a mask according to the invention.

A mask comprising a magnesium diaphragm can be manufactured by various methods, which are represented in detail in Methods A to E.

All the methods have in common that the magnesium diaphragm is first deposited in the form of a thin layer on an auxiliary carrier, which is then removed or is retained if a suitable material is used for the auxiliary carrier.

Method A

An auxiliary carrier 1 of a synthetic material, for example, a polyimide foil, which is adhered to a supporting ring 3 and is stretched on it, has applied to it a magnesium layer 5 by cathode sputtering with the following parameters:

|  |  |
| --- | --- |
| HF generator | 13.6 MHz |
| Electrode diameter | 200 mm |
| Electrode gap | 45 mm |
| Working pressure of the gas atmosphere (Ar) | 25 $\mu$bar |
| Potential at the cathode | 600 V. |

Magnesium layers 1 to 2 $\mu$m thickness are maufactured. The thickness of the layer depends upon the duration of the cathode sputtering process and can be adjusted correspondingly.

The composite diaphragm of magnesium-polyimide thus manufactured has a very high breaking strength and retains its accuracy to size even under conditions which would have adversely affected a diaphragm consisting solely of polyimide. Diaphragms having a diameter of up to 60 mm were manufactured; however, with this value the limit of the possibilities is not yet reached. In the FIGURE, an absorber pattern 7 is present on the magnesium layer 5 constituting the diaphragm. The auxiliary support may be retained as a component of the mask (this case is shown in the FIGURE), but it may alternatively be removed (as described in the method B to E) so that self-supporting diaphragms consisting only of the magnesium layer 5 are then obtained.

Method B

A self-supporting magnesium diaphragm can be manufactured in such a manner that a magnesium layer, as described for the method A, is first deposited on a polyimide foil and that the polyimide foil is removed from the magnesium layer in a subsequent etching process. The polyimide foil can be removed either by a plasma etching process in an oxygen plasma or by reactive ion etching, for example with the following parameters:

|  |  |
| --- | --- |
| HF generator | 27.25 MHz |
| Electrode diameter | 200 mm |
| Potential at the cathode | 100 V |
| Working pressure of the gas atmosphere (O$_2$) | 150 $\mu$bar. |

The etching process works selectively so that the magnesium layer is substantially not attacked because of the defined MgO layer to be formed on it. The self-supporting Mg diaphragm is already stabilized by a surface layer of MgO having a thickness of a few tens of nm.

In the manner described, Mg diaphragms having a diameter of 1.5 cm and a thickness of 1.0 $\mu$m were manufactured; These values do not represent the upper limit either.

Method C

Instead of a polyimide foil, as described for method A, a polycarbonate foil may be used as an auxiliary carrier for the deposition of the magnesium layer. If a self-supporting Mg diaphragm is to be formed from the deposited magnesium layer, the polycarbonate foil can be removed in a swelling process. As a swelling and detaching agent use may be made of dichloromethane.

Method D

A self supporting Mg diaphragm can alternatively be manufactured by the following processing steps:

A gold layer having a thickness of 50 nm is applied by cathode sputtering to an auxiliary carrier in the form of a glass plate whose surface has a low roughness in the range of both short-wave and long-wave radiation. The working pressure of the gas atmosphere of argon is efficaciously 12 $\mu$bar with a power of 125 W. A TiO$_2$ layer is applied by cathode sputtering to this gold layer at a working pressure of the gas atmosphere of O$_2$ of 12 $\mu$bar and with a power of 125 W. This TiO$_2$ layer acts as a diffusion barrier. Subsequently, a layer of Mg is applied by cathode sputtering to the layer of TiO$_2$, as described for method A. The gold layer poorly adhering to the glass plate permits of pulling the Au/TiO$_2$/Mg layer off the glass plate; for this purpose, an auxiliary frame is adhered to the layer to be pulled off. In order to promote the detaching process, the coated glass plate can be immersed in a bath of, for example, glycerine or a glycol. The detached Mg diaphragm can then be stretched and adhered to a frame of, for example, glass in the desired manner. Thus, diaphragms were obtained having a diameter of 90 mm; this value does not represent an upper limit, however. The thickness of the diaphragms thus manufactured was in the range of from 1.8 to 2.2 nm, which does not represent the lower limit attainable, however.

Method E

In order to render the detaching process described for method D more effective, that is to say in order to increase the output of usable diaphragms, the Mg layer may be additionally made more stable by means of a lacquer layer having a thickness of about 2 μm and consisting of, for example, a commercially available photolacquer. The photolacquer layer is then removed by an etching step, for example by etching by means of cathode sputtering in an oxygen plasma.

Diaphragms of magnesium are opaque to visible light. In order to permit carrying out direct adjustment processes by means of laser beams, it is therefore efficacious to provide the diaphragm with adjustment windows which consist of a material transparent to visible light, for example, of polyimide.

Subsequently, the absorber pattern is formed on the diaphragm manufactured by means of the method A to E. For this purpose, multilayer absorber layers, for example of tungsten and molybdenum, have proved particularly suitable. To this end, the procedure can be as follows:

Both the tungsten layer and the molybdenum layer are applied by cathode sputtering. The tungsten layer is manufactured efficaciously with the following parameters:

| | |
|---|---|
| HF generator | 13.6 MHz; |
| Electrode diameter | 200 mm; |
| Electrode gap | 42 mm; |
| Working pressure of the gas atmosphere (Ar) | 2 Pa; |
| Potential at the electrode | 800 V; |
| Potential at the mask carrier | 40 V. |

The molybdenum can be applied by cathode sputtering under the following conditions:

| | |
|---|---|
| HF generator | 13.6 MHz; |
| Electrode diameter | 200 mm; |
| Electrode gap | 42 mm; |
| Working pressure of the gas atmosphere (Ar) | 2 Pa; |
| Potential at the electrode | 700 V; |
| Potential at the mask carrier. | 95 V. |

This absorber layer can be structured in accordance with the desired mask pattern by means of known techniques, for example, by means of electron beam lithography.

What is claimed is:

1. A mask for forming patterns in lacquer layers by x-ray lithography comprising:
    a multilayer diaphragm being highly transparent to X-ray radiation, said multilayer diaphragm including a layer of magnesium and at least one additional layer, and
    a patterned layer on one major surface of said multilayer diaphragm for absorbing said X-ray radiation, said patterned layer contacting said layer of magnesium, wherein said at least one additional layer includes a layer of gold and a layer of titanium oxide ($TiO_2$), said layer of titanium oxide ($TiO_2$) contacting said layer of magnesium at a side opposite to said patterned layer.

* * * * *